(12) United States Patent
Diest et al.

(10) Patent No.: US 11,233,189 B2
(45) Date of Patent: *Jan. 25, 2022

(54) NANOVOIDED TUNABLE BIREFRINGENCE

(71) Applicant: Facebook Technologies, LLC, Menlo Park, CA (US)

(72) Inventors: Kenneth Diest, Kirkland, WA (US); Andrew John Ouderkirk, Redmond, WA (US); Gregory Olegovic Andreev, Redmond, WA (US); Erik Shipton, Kenmore, WA (US); Tanya Malhotra, Redmond, WA (US); Barry David Silverstein, Kirkland, WA (US); Christopher Yuan Ting Liao, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 194 days.

This patent is subject to a terminal disclaimer.

(21) Appl. No.: 16/262,433

(22) Filed: Jan. 30, 2019

(65) Prior Publication Data

US 2020/0183199 A1 Jun. 11, 2020

Related U.S. Application Data

(60) Provisional application No. 62/777,825, filed on Dec. 11, 2018.

(51) Int. Cl.
*G02F 1/03* (2006.01)
*G02F 1/07* (2006.01)
(Continued)

(52) U.S. Cl.
CPC ............ *H01L 41/193* (2013.01); *B05D 3/067* (2013.01); *B05D 3/101* (2013.01); *B05D 3/108* (2013.01);
(Continued)

(58) Field of Classification Search
CPC ......... B82Y 30/00; B82Y 40/00; C08F 14/20; C08F 14/22; C08G 77/04; C08L 83/04;
(Continued)

(56) References Cited

U.S. PATENT DOCUMENTS 5,095,515 A 3/1992 Seaver
6,420,441 B1 7/2002 Allen et al.
(Continued)

OTHER PUBLICATIONS

Si et al., "Liquid-Crystal-Enabled Active Plasmonics: A Review", Materials, vol. 7, No. 2, Feb. 18, 2014, pp. 1296-1317. (Year: 2014).*
(Continued)

*Primary Examiner* — Mahidere S Sahle
(74) *Attorney, Agent, or Firm* — FisherBroyles, LLP

(57) ABSTRACT

A form birefringent optical element includes a structured layer and a dielectric environment disposed over the structured layer. At least one of the structured layer and the dielectric environment includes a nanovoided polymer, the nanovoided polymer having a first refractive index in an unactuated state and a second refractive index different than the first refractive index in an actuated state. Actuation of the nanovoided polymer can be used to reversibly control the form birefringence of the optical element. Various other apparatuses, systems, materials, and methods are also disclosed.

19 Claims, 6 Drawing Sheets

(51) Int. Cl.

| | | |
|---|---|---|
| *H01L 41/193* | (2006.01) | |
| *H01L 41/09* | (2006.01) | |
| *H01L 41/047* | (2006.01) | |
| *H04R 17/00* | (2006.01) | |
| *G02B 27/01* | (2006.01) | |
| *G02F 1/01* | (2006.01) | |
| *G02F 1/061* | (2006.01) | |
| *G02B 5/08* | (2006.01) | |
| *G02B 5/30* | (2006.01) | |
| *G02B 27/10* | (2006.01) | |
| *G06F 3/01* | (2006.01) | |
| *C08F 14/20* | (2006.01) | |
| *C08F 14/22* | (2006.01) | |
| *C08G 77/04* | (2006.01) | |
| *H01L 41/083* | (2006.01) | |
| *H01L 41/18* | (2006.01) | |
| *G02B 5/18* | (2006.01) | |
| *F21V 8/00* | (2006.01) | |
| *G02F 1/29* | (2006.01) | |
| *H01L 41/04* | (2006.01) | |
| *H01L 41/253* | (2013.01) | |
| *H02N 1/00* | (2006.01) | |
| *B05D 3/06* | (2006.01) | |
| *B05D 3/10* | (2006.01) | |
| *G02C 7/08* | (2006.01) | |
| *G06K 9/00* | (2006.01) | |
| *G06T 19/00* | (2011.01) | |
| *C08L 83/04* | (2006.01) | |
| *B82Y 30/00* | (2011.01) | |
| *B82Y 40/00* | (2011.01) | |
| *G02B 7/04* | (2021.01) | |
| *G02B 26/00* | (2006.01) | |

(52) U.S. Cl.
CPC .............. *C08F 14/20* (2013.01); *C08F 14/22* (2013.01); *C08G 77/04* (2013.01); *G02B 5/08* (2013.01); *G02B 5/1847* (2013.01); *G02B 5/3083* (2013.01); *G02B 6/0026* (2013.01); *G02B 27/0172* (2013.01); *G02B 27/0176* (2013.01); *G02B 27/10* (2013.01); *G02C 7/083* (2013.01); *G02F 1/0102* (2013.01); *G02F 1/061* (2013.01); *G02F 1/292* (2013.01); *G06F 3/011* (2013.01); *G06K 9/00671* (2013.01); *G06T 19/006* (2013.01); *H01L 41/04* (2013.01); *H01L 41/042* (2013.01); *H01L 41/047* (2013.01); *H01L 41/0472* (2013.01); *H01L 41/083* (2013.01); *H01L 41/09* (2013.01); *H01L 41/0913* (2013.01); *H01L 41/0986* (2013.01); *H01L 41/18* (2013.01); *H01L 41/253* (2013.01); *H02N 1/006* (2013.01); *H04R 17/00* (2013.01); *B05D 2201/02* (2013.01); *B05D 2350/30* (2013.01); *B05D 2400/00* (2013.01); *B05D 2502/00* (2013.01); *B05D 2503/00* (2013.01); *B05D 2504/00* (2013.01); *B05D 2505/00* (2013.01); *B05D 2518/12* (2013.01); *B82Y 30/00* (2013.01); *B82Y 40/00* (2013.01); *C08L 83/04* (2013.01); *G02B 7/04* (2013.01); *G02B 26/00* (2013.01); *G02B 2027/0178* (2013.01); *G02F 2202/022* (2013.01)

(58) Field of Classification Search
CPC .... G02B 5/08; G02B 5/3083; G02B 27/0172; G02B 27/10; G02B 27/0176; G02B 2027/0178; G02F 1/0102; G02F 1/061; G02F 2202/022; G06F 3/011; H01L 41/193; H01L 41/047; H01L 41/083; H01L 41/0986; H01L 41/18; H01L 41/09; H01L 41/0913; H01L 41/0472; H04R 17/00

USPC .............................. 359/245, 290, 315, 322
See application file for complete search history.

(56) References Cited

U.S. PATENT DOCUMENTS

| | | |
|---|---|---|
| 6,628,850 B1 | 9/2003 | Yao |
| 7,230,771 B2 | 6/2007 | Kuiper et al. |
| 8,477,402 B2 | 7/2013 | Duncan et al. |
| 8,848,280 B2 | 9/2014 | Arsenault |
| 9,228,822 B2 | 1/2016 | Majidi et al. |
| 10,670,782 B2 | 6/2020 | Arbabi et al. |
| 10,690,946 B2 | 6/2020 | Wilson |
| 10,749,448 B2 | 8/2020 | Lindsay et al. |
| 11,022,856 B1 | 6/2021 | Ouderkirk et al. |
| 11,025,175 B1 | 6/2021 | Landig et al. |
| 2002/0009251 A1 | 1/2002 | Byrne |
| 2002/0135863 A1 | 9/2002 | Fukshima et al. |
| 2002/0186928 A1 | 12/2002 | Curtis |
| 2005/0196552 A1 | 9/2005 | Lehmann et al. |
| 2006/0024976 A1 | 2/2006 | Waldfried et al. |
| 2006/0028734 A1 | 2/2006 | Kuiper et al. |
| 2007/0020404 A1* | 1/2007 | Seiberle .................. G02B 1/11 428/1.2 |
| 2007/0205398 A1 | 9/2007 | Smela et al. |
| 2007/0263963 A1 | 11/2007 | Hughes et al. |
| 2008/0137031 A1 | 6/2008 | Hillis et al. |
| 2008/0171431 A1 | 7/2008 | Yu et al. |
| 2008/0197518 A1 | 8/2008 | Aylward et al. |
| 2008/0224103 A1 | 9/2008 | Arsenault et al. |
| 2009/0034051 A1 | 2/2009 | Arsenault et al. |
| 2009/0296188 A1 | 12/2009 | Jain et al. |
| 2010/0075056 A1 | 3/2010 | Axisa et al. |
| 2011/0149410 A1 | 6/2011 | Blum |
| 2011/0242638 A1 | 10/2011 | Horning et al. |
| 2012/0019185 A1 | 1/2012 | Guidarelli et al. |
| 2012/0029416 A1 | 2/2012 | Parker et al. |
| 2012/0200931 A1 | 8/2012 | Haag et al. |
| 2012/0211261 A1 | 8/2012 | Aabloo et al. |
| 2012/0298200 A1 | 11/2012 | Niggemann et al. |
| 2013/0176628 A1 | 7/2013 | Batchko et al. |
| 2013/0202867 A1 | 8/2013 | Coggio et al. |
| 2013/0222881 A1 | 8/2013 | Aizenberg et al. |
| 2013/0279151 A1 | 10/2013 | Ouderkirk et al. |
| 2013/0335807 A1 | 12/2013 | Arsenault et al. |
| 2014/0133010 A1 | 5/2014 | Han et al. |
| 2014/0204372 A1 | 7/2014 | Pang et al. |
| 2014/0217539 A1 | 8/2014 | Rantala |
| 2014/0234995 A1 | 8/2014 | Li et al. |
| 2014/0266647 A1 | 9/2014 | Visitacion et al. |
| 2014/0312737 A1 | 10/2014 | Jenninger et al. |
| 2015/0109657 A1 | 4/2015 | Baumberg et al. |
| 2015/0205126 A1 | 7/2015 | Schowengerdt |
| 2015/0241698 A1 | 8/2015 | Schowengerdt |
| 2015/0259493 A1 | 9/2015 | Nederkoorn et al. |
| 2015/0315012 A1 | 11/2015 | Wiersma et al. |
| 2016/0036353 A1 | 2/2016 | Stasik et al. |
| 2016/0103341 A1 | 4/2016 | Long et al. |
| 2016/0187985 A1 | 6/2016 | Lim et al. |
| 2016/0283773 A1 | 9/2016 | Popovich et al. |
| 2017/0023807 A1 | 1/2017 | Chang-Hasnain et al. |
| 2017/0031078 A1 | 2/2017 | Thompson et al. |
| 2017/0090570 A1 | 3/2017 | Rain et al. |
| 2017/0192595 A1 | 7/2017 | Choi et al. |
| 2017/0285348 A1 | 10/2017 | Ayres et al. |
| 2017/0365630 A1 | 12/2017 | Yang |
| 2018/0093456 A1 | 4/2018 | Van Overmeere et al. |
| 2018/0164627 A1 | 6/2018 | Oh |
| 2018/0356303 A1 | 12/2018 | Li et al. |
| 2019/0296218 A1 | 9/2019 | Ouderkirk et al. |
| 2019/0361318 A1 | 11/2019 | Johnson et al. |
| 2020/0076328 A1 | 3/2020 | Cha et al. |
| 2020/0183168 A1 | 6/2020 | Spann et al. |

(56) References Cited

U.S. PATENT DOCUMENTS

| | | |
|---|---|---|
| 2020/0183199 A1 | 6/2020 | Diest et al. |
| 2020/0183200 A1* | 6/2020 | Diest .................... G02F 1/0102 |
| 2020/0185590 A1 | 6/2020 | Malhotra et al. |

OTHER PUBLICATIONS

Wilson, Benjamin K. et al., Variable Wave Plate via Tunable Form—Birefringent Structures, Aug. 2008, Journal of Microelectromechanical Systems, vol. 17, No. 4, pp. 1039-1046 (Year: 2008).*

Non-Final Office Action received for U.S. Appl. No. 16/351,477 dated Jun. 23, 2020, 27 pages.

Fratzl et al., "The mechanics of tessellations—bioinspired strategies for fracture resistance", Chem Soc Rev., vol. 45, No. 2, Jan. 21, 2016, pp. 252-267.

Gohtani et al., "Nano-Emulsions; Emulsification Using Low Energy Methods", Japan Journal of Food Engineering, vol. 15, No. 3, Sep. 1, 2014, pp. 119-130.

Michler et al., "The physics and micro-mechanics of nano-voids and nano-particles in polymer combinations", ScienceDirect, Polymer, vol. 54, No. 13, Jun. 7, 2013, pp. 1-14.

Zhu et al., "Large deformation and electromechanical instability of a dielectric elastomer tube actuator", Journal of Applied Physics, vol. 108, Issue 7, Article 074113, Oct. 13, 2010, pp. 1-6.

Cameron et al., "Linear actuation in coextruded dielectric elastomer tubes", ScienceDirect, Sensors and Actuators A: Physical, vol. 147, Issue 1, Sep. 15, 2008, pp. 286-291.

Catmull et al., "Recursively generated B-spline surfaces on arbitrary topological meshes", Computer-Aided Design, vol. 10, No. 6, Nov. 1, 1978, pp. 183-188.

Loop, Charles Teorell, "Smooth Subdivision Surfaces Based on Triangles", Thesis, Master of Science, University of Utah, Aug. 1, 1987, 74 pages.

Merkel et al., "Gas Sorption, Diffusion, and Permeation in Poly(dimethylsiloxane)", Journal of Polymer Science: Part B: Polymer Physics, vol. 38, Feb. 1, 2000, pp. 415-434.

Kim et al., "Mathematical analysis of oxygen transfer through polydimethylsiloxane membrane between double layers of cell culture channel and gas chamber in microfluidic oxygenator", Microfluidics and Nanofluidics, vol. 15, Feb. 1, 2013, 29 pages.

Cruz-Hernandez et al., "Phase Control Approach to Hysteresis Reduction", IEEE Transactions on Control Systems Technology, vol. 9, No. 1, Jan. 1, 2001, pp. 17-26.

Zuev, Yu.S., "Elastomer-gas systems", International Polymer Science and Technology, vol. 28, No. 2, Feb. 1, 2001, pp. 43-53.

Shir, Daniel Jay-Lee et, "Three-Dimensional Nanofabrication with Elastomeric Phase Masks", PhD Thesis, University of Illinois of Urbana-Champaign, Oct. 17, 2007, 138 pages.

Mullin et al., "Pattern Transformation Triggered by Deformation", Physical Review Letters, vol. 99, No. 8, 2007, 4 pages.

Babaee et al., "3D Soft Metamaterials with Negative Poisson's ratio", Advanced Materials, vol. 25, No. 36, 2013, 18 pages.

Bertoldi et al., "Novel negative Poisson's ratio behavior induced by an elastic instability", Advanced Materials, vol. 22, No. 3, 2010, pp. 1-11.

Overvelde et al., "Relating pore shape to the non-linear response of periodic elastomeric structures", Journal of the Mechanics and Physics of Solids, vol. 64, 2014, 16 pages.

Shen et al., "Simple cubic three-dimensional auxetic metamaterials", Physic Status Solidi (B), vol. 251, No. 8, 2014, pp. 1515-1522.

Correa et al., "Negative Stiffness Honeycombs for Recoverable Shock Isolation", Rapid Prototyping Journal, vol. 21, No. 2, 2015, pp. 702-713.

Coulais et al., "Discontinuous Buckling of Wide Beams and Metabeams", Physical Review Letters, vol. 115, 2015, 7 pages.

Bickel et al., "Design and Fabrication of Materials with Desired Deformation Behavior", ACM Transactions on Graphics (TOG), vol. 29, No. 4, Jul. 2010, 10 pages.

Rosset et al., "Small, fast, and tough: Shrinking down integrated elastomer transducers", Applied Physics Reviews, vol. 3, No. 3, 2016, pp. 1-27.

Plante et al., "Large-scale failure modes of dielectric elastomer actuators", International Journal of Solids and Structures, vol. 43, 2006, pp. 7727-7751.

"Optotune DEAPs", Electroactive polymers, URL: https://www.optotune.com/technology/electroactive-polymers, 2019, 3 pages.

Product—Novasentis, "EMP Haptic Actuators For Sensory Innovation", URL: https://www.novasentis.com/product, 2019, 4 pages.

Rosset et al., "Mechanical characterization of a dielectric elastomer microactuator with ion-implanted electrodes", Sensor and Actuators A 144, 2008, 25 pages.

Gerratt et al., "Dielectric breakdown of PDMS thin films", Journal of Micromechanics and Microengineering, vol. 23, Apr. 26, 2013, 8 pages.

Hunt et al., "A self-healing dielectric elastomer actuator", Applied Physics Letters, vol. 104, 2014, 4 pages.

Skov et al., "Optimization Techniques for Improving the Performance of Silicone-Based Dielectric Elastomers", Advanced Engineering Materials, vol. 20, 2018, pp. 1-21.

Mazurek et al., "Glycerol as high-permittivity liquid filler in dielectric silicone elastomers", Journal of Applied Polymer Science, vol. 133, No. 43, 2016, 28 pages.

Rao et al., "Synthesis of flexible silica aerogels using methyltrimethoxysilane (MTMS) precursor", Journal of Colloid and Interface Science, vol. 300, 2006, pp. 279-285.

Seo et al., "Reticulated Nanoporous Polymers by Controlled Polymerization-Induced Microphase Separation", Science, vol. 336, Jun. 15, 2012, 5 pages.

Jennings, S.G., "The mean free path in air", Journal of Aerosol Science, vol. 19, No. 2, 1988, pp. 1-2.

Gupta et al., "Nanoemulsions: formation, properties and applications", Soft Matter, 2016, 16 pages.

Helgeson et al., "Mesoporous organohydrogels from thermogelling photocrosslinkable nanoemulsions", Nature Materials, vol. 11, Apr. 2012, pp. 344-352.

Guha et al., "Creating nanoscale emulsions using condensation", Nature Communications, 8:1371, 2017, pp. 1-7.

Meier et al., "Microemulsion elastomers", Colloid Polymer Science, vol. 274, 1996, pp. 218-226.

Richter et al., "Design considerations of form birefringent microstructures", Applied Optics, vol. 34, No. 14, May 10, 1995, pp. 2421-2429.

Mahadik et al., "Elastic and Superhydrophobic Monolithic Methyltrimethyoxysilane-based Silica Aerogels by Two-step sol-gel process", Journal Microelectron, vol. 23, No. 1, 2016, pp. 35-39.

Jeon et al., "Three dimensional nanoporous density graded materials formed by optical exposures through conformable phase masks", Applied Physics Letters, vol. 89, Article 253101, Dec. 18, 2006, pp. 1-3.

Sultan et al., "Electrical Breakdown Testing of Materials Intended for use in PV Modules", 3rd Atlas/NIST Workshop an Photovoltaics, Dec. 8-9, 2015, 29 pages.

Sekitani et al., "Stretchable active-matrix organic light-emitting diode display using printable elastic conductors", Nature Materials, vol. 8, May 10, 2009, pp. 494-499.

Someya et al., "Conformable, flexible, large-area networks of pressure and thermal sensors with organic transistor active matrixes", PNAS, vol. 102, No. 35, Aug. 30, 2005, pp. 12321-12325.

Wegener et al., "Controlled inflation of voids in cellular polymer ferroelectrets: Optimizing electromechanical transducer properties", Applies Physics Letters, vol. 84, No. 3, Jan. 19, 2004, pp. 392-394.

Wu et al., "Fabrication of ultralong perovskite structure nanotubes", RSC Advances, vol. 8, Jan. 2, 2018, pp. 367-373.

Wu et al., "Efficient multi-barrier thin film encapsulation of OLED using alternating Al2O3 and polymer layers", RSC Advances, vol. 8, Feb. 2, 2018, pp. 5721-5727.

Yang et al., "Harnessing Surface Wrinkle Patterns in Soft Matter", Advanced Functional Materials, vol. 20, Jul. 29, 2010, pp. 2550-2564.

(56) References Cited

OTHER PUBLICATIONS

Zhang et al., "Highly Porous Polyhedral Silsesquioxane Polymers Synthesis and Characterization", J. Am. Chem. Soc., vol. 120, Aug. 11, 1998, pp. 8380-8391.
Yang et al., "Avoiding the pull-in instability of a dielectric elastomer film and the potential for increased actuation and energy harvesting", Soft Matter, vol. 13, Jan. 6, 2017, pp. 4552-4558.
Jang et al., "Mechanically Tunable Three-Dimensional Elastomeric Network/Air Structures via Interference Lithography", Nano Letters, vol. 6, No. 4, Mar. 15, 2006, pp. 740-743.
Rogers et al., "Materials and Mechanics for Stretchable Electronics", Science, vol. 327, Mar. 26, 2010, pp. 1603-1607.
Wolak et al., "Dielectric response of structured multilayered polymer films fabricated by forced assembly", Applied Physics Letters, vol. 92, Article 113301, Mar. 17, 2008, pp. 1-3.
Mackey et al., "Enhanced breakdown strength of multilayered films fabricated by forced assembly microlayer coextrusion". Journal of Physics D: Applied Physics, vol. 42, Article 175304, Aug. 12, 2009, pp. 1-12.
Ieda, Masayuki, "Dielectric Breakdown Process of Polymers", IEEE Transactions on Electrical Insulation, vol. EI-15, No. 3, Jun. 1980, pp. 206-224.
Moore, Duncan T., "Gradient Index Optics", Optical Elements, IVPV Handbook of Optics, 2nd Edition, vol. II—Devices, Measurements, and Properties, 1995, pp. 9.1-9.10.
Nguyen et al., "Synthesis, Processing, and Characterization of Inorganic-Organic Hybrid Cross-Linked Silica, Organic Polyimide, and Inorganic Aluminosilicate Aerogels", National Aeronautics and Space Administration STI Program, NASA/CR-2014-218328, Jul. 2014, 58 pages.
Shaiz, Narkis, "Gradient-Index Optics", Science Applications International Corp., Final Report, Mar. 31, 2010, 103 pages.
Teichman et al., "Gradient Index Optics at DARPA", Institute for Defense Analyses, IDA Document D-5027, Nov. 2013, 69 pages.
Tanaka et al., "Polymer Nanocomposites as Dielectrics and Electrical Insulation-perspectives for Processing Technologies, Material Characterization and Future Applications", IEEE Transactions on Dielectrics and Electrical Insulation, vol. 11, No. 5, Oct. 2004, pp. 763-784.
Matyka et al., "How to Calculate Tortuosity Easily?", AIP Conference Proceedings, Mar. 26, 2012, 6 pages.
Cheng et al., "Controlled in Situ Nanocavitation in Polymeric Materials", Advanced Materials, vol. 23, Jan. 2011, pp. 409-413.
Solans et al., "Nano-emulsions: Formation by low-energy methods", Colloid & Interface Science, vol. 17, Issue 5, Oct. 2012, pp. 246-254.
Fuse et al., "Possible Mechanism of Superior Partial-Discharge Resistance of Polyamide Nanocomposites", Annual Report Conference on Electrical Insulation and Dielectric Phenomena, 2004, pp. 322-325.
Wu et al., "3D Printed Silicones with Shape Memory", Scientific Reports, vol. 7, No. 4664, Jul. 5, 2017, pp. 1-6.
Johnson et al., "A brief review of atomic layer deposition:from fundamentals to applications", Materials Today, vol. 17, No. 5, Jun. 2014, pp. 236-246.
Sole et al., "Nano-emulsions prepared by the phase inversion composition method: Preparation variables and scale up", Journal of Colloid and Interface Science, vol. 344, 2010, pp. 417-423.
Camino et al., "Polydimethylsiloxane thermal degradation Part 1. Kinetic aspects", Polymer, vol. 42, 2001, pp. 2395-2402.
Tanaka et al., "Proposal of a Multi-core Model for Polymer Nanocomposite Dielectrics", IEEE Transactions on Dielectrics and Electrical Insulation, vol. 12, No. 4, Aug. 2005, pp. 669-681.
Loiko et al., "Experimental results and theoretical model to describe angular dependence of light scattering by monolayer of nematic droplets", Journal of Quantitative Spectroscopy and Radiative Transfer, vol. 178, Jul. 2016, 11 pages.
Waldern et al., "Digilens Switchable Bragg grating waveguide optics for augmented reality applications", Proc. SPIE 10676, Digital optics for Immersive Displays, May 21, 2018, 1 page.
Diest et al., "Nanovoided Tunable Optics", U.S. Appl. No. 16/262,439, filed Jan. 30, 2019, 57 pages.
Ouderkirk et al., "Nanovoided Graded-Index Optical Elements, Optical Arrays, and Methods of Forming the Same", U.S. Appl. No. 16/426,737, filed May 30, 2019, 113 pages.
Diest et al., "Polymer Materials Including Coated Nanovoids and Methods and Systems for Forming the Same", U.S. Appl. No. 16/512,335, filed Jul. 15, 2019, 133 pages.
Sharma et al., "Switchable Electroactive Devices for Head-Mounted Displays", U.S. Appl. No. 16/351,477, filed Mar. 12, 2019, 108 pages.
Spann et al., "Nanovoided Polymers Having Shaped Voids", U.S. Appl. No. 16/703,674, filed Dec. 4, 2019, 149 pages.
Landig et al., "Planarization Layers for Nanovoided Polymers", U.S. Appl. No. 16/364,977, filed Mar. 26, 2019, 125 pages.
Ouderkirk et al., "Waveguide with Switchable Input", U.S. Appl. No. 16/263,829, filed Jan. 31, 2019, 55 pages.
Landig et al., "Multiple Layers Between Electrodes Including Nanovoided Polymer", U.S. Appl. No. 16/386,232, filed Apr. 16, 2019, 126 pages.
Landig et al., "Nanovoided Polymers Using Phase Inversion", U.S. Appl. No. 16/449,964, filed Jun. 24, 2019, 139 pages.
Spann et al., "Reduced Hysteresis and Reduced Creep in Nanovoided Polymer Devices", U.S. Appl. No. 16/703,291, filed Dec. 4, 2019, 152 pages.
International Search Report and Written Opinion received for PCT Application Serial No. PCT/US2019/064367 dated Mar. 11, 2020, 17 pages.
Malhotra et al., "Spatially Addressable Nanovoided Polymers", U.S. Appl. No. 16/417,911, filed May 21, 2019, 138 pages.
Landig et al., "Fabrication Of Shaped Voids", U.S. Appl. No. 16/669,970, filed Oct. 31, 2019, 110 pages.
International Search Report and Written Opinion received for PCT Application Serial No. PCT/US2019/064395 dated Mar. 12, 2020, 17 pages.
Si et al., "Liquid-Crystal-Enabled Active Plasmonics: A Review", Materials, vol. 7, No. 2, Feb. 18, 2014, pp. 1296-1317.
Crawford, Gregory P., "Electrically Switchable Bragg Gratings", Optics & Photonics News, Apr. 30, 2003, pp. 54-59.
Dickson et al., "Electronically Controlled Surface Plasmon Dispersion and Optical Transmission through Metallic Hole Arrays Using Liquid Crystal", Nano Letters, vol. 8, No. 1, Jan. 1, 2008, pp. 281-286.
U.S. Appl. No. 16/263,829, filed Jan. 31, 2019.
U.S. Appl. No. 16/351,477, filed Mar. 12, 2019.
U.S. Appl. No. 16/426,737, filed May 30, 2019.
U.S. Appl. No. 16/512,335, filed Jul. 15, 2019.
Non-Final Office Action received for U.S. Appl. No. 16/364,977 dated Oct. 19, 2020, 38 pages.
Preinterview first office action received for U.S. Appl. No. 16/262,439 dated Nov. 30, 2020, 42 pages.
Final office action received for U.S. Appl. No. 16/351,477 dated Dec. 1, 2020, 38 pages.
Preinterview first office action received for U.S. Appl. No. 16/263,829 dated Dec. 22, 2020, 36 pages.
Non-Final office action received for U.S. Appl. No. 16/449,964 dated Nov. 24, 2020, 91 pages.
Holda et al., "Understanding and guiding the phase inversion process for synthesis of solvent resistant nanofiltration membranes", J. Appl. Polym. Sci. 42130, 2015, 17 pages.
Struzynska-Piron et al., "Synthesis of solvent stable polymeric membranes via UV depth-curing", Chem. Commun., vol. 49, 11494, 2013, 3 pages.
Notice of Allowance received for U.S. Appl. No. 16/262,439 dated Apr. 6, 2021, 38 pages.
Notice of Allowance received for U.S. Appl. No. 16/351,477 dated Mar. 29, 2021, 28 pages.
Notice of Allowance received for U.S. Appl. No. 16/364,977 dated Feb. 2, 2021, 40 pages.
Notice of Allowance received for U.S. Appl. No. 16/263,829 dated Feb. 4, 2021, 27 pages.
Notice of Allowance received for U.S. Appl. No. 16/449,964 dated Mar. 4, 2021, 21 pages.

(56) References Cited

OTHER PUBLICATIONS

Notice of Allowance received for U.S. Appl. No. 16/703,291 dated Jun. 3, 2021, 61 pages.
International Preliminary Report on Patentability received for PCT Application Serial No. PCT/US2019/064395 dated Jun. 24, 2021, 10 pages.
International Preliminary Report on Patentability received for PCT Application Serial No. PCT/US2019/064367 dated Jun. 24, 2021, 10 pages.

* cited by examiner

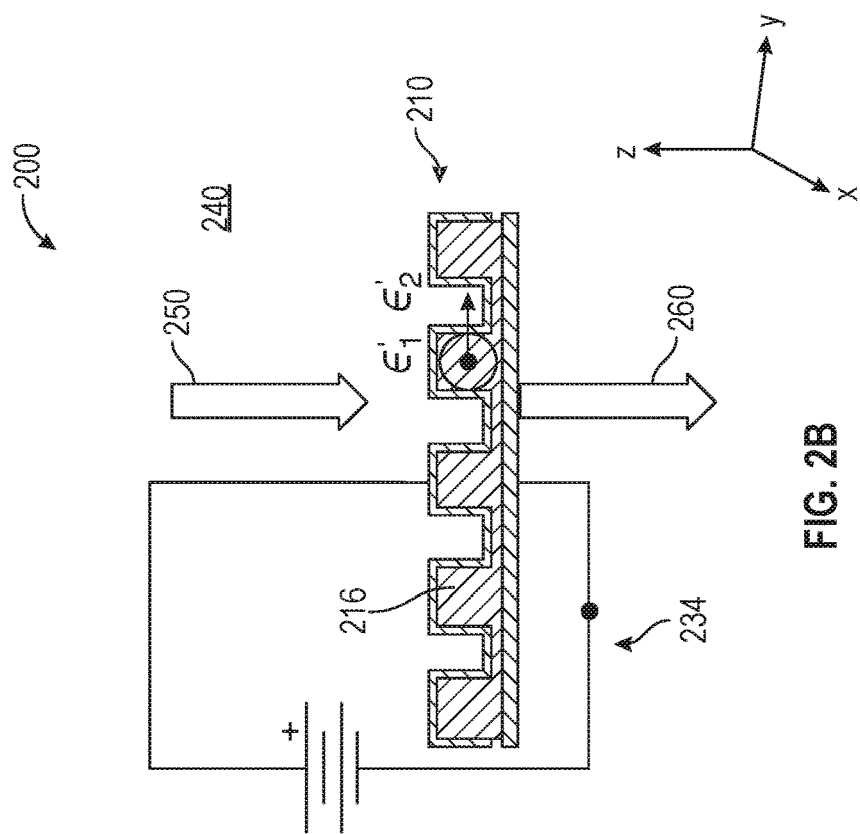
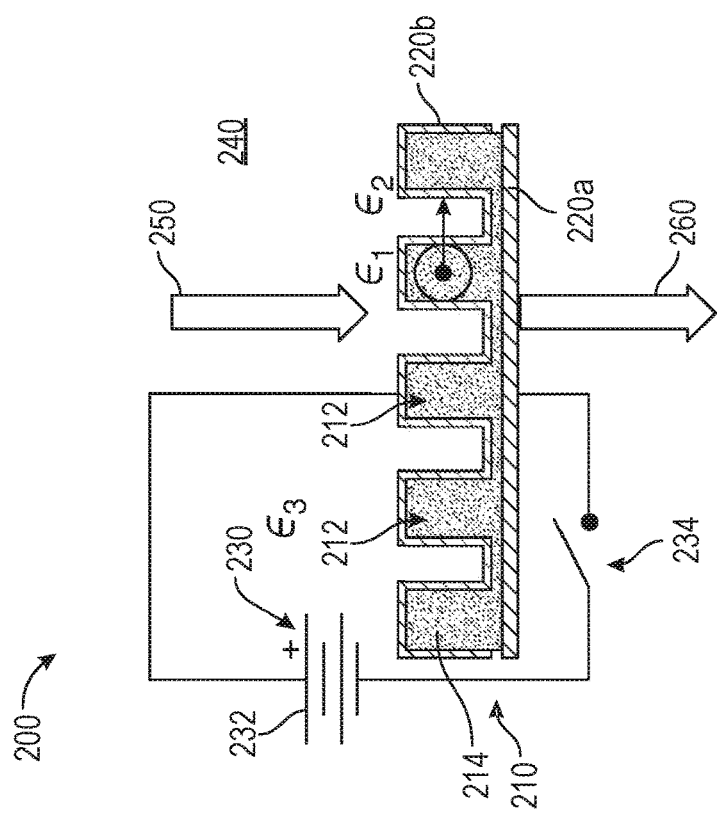
FIG. 2B
FIG. 2A

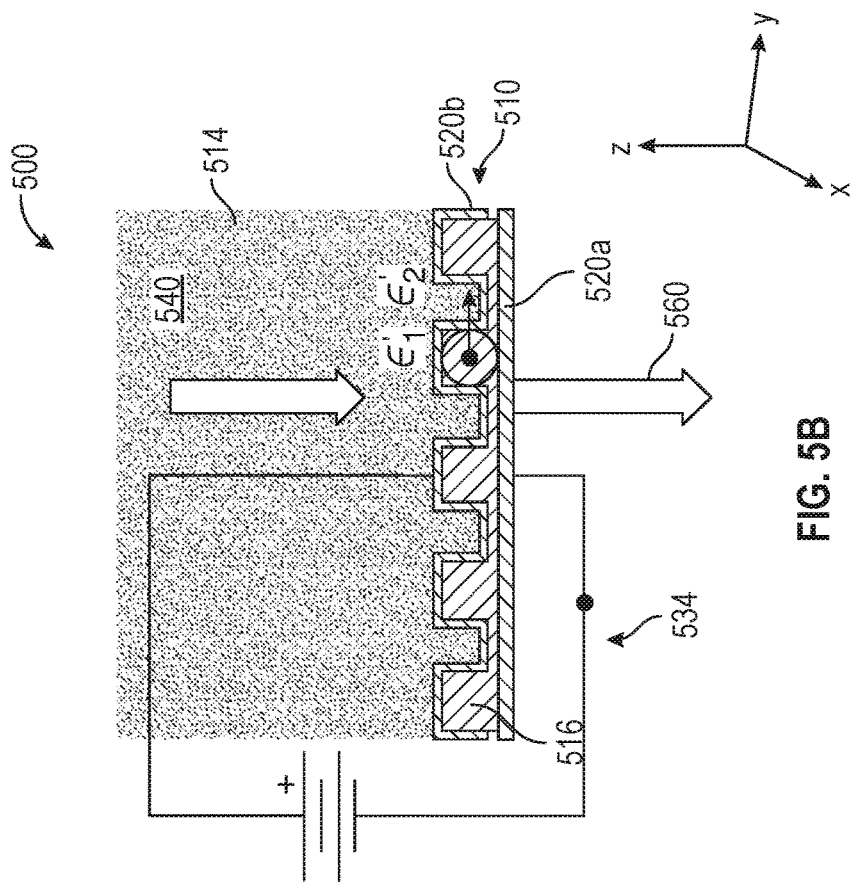
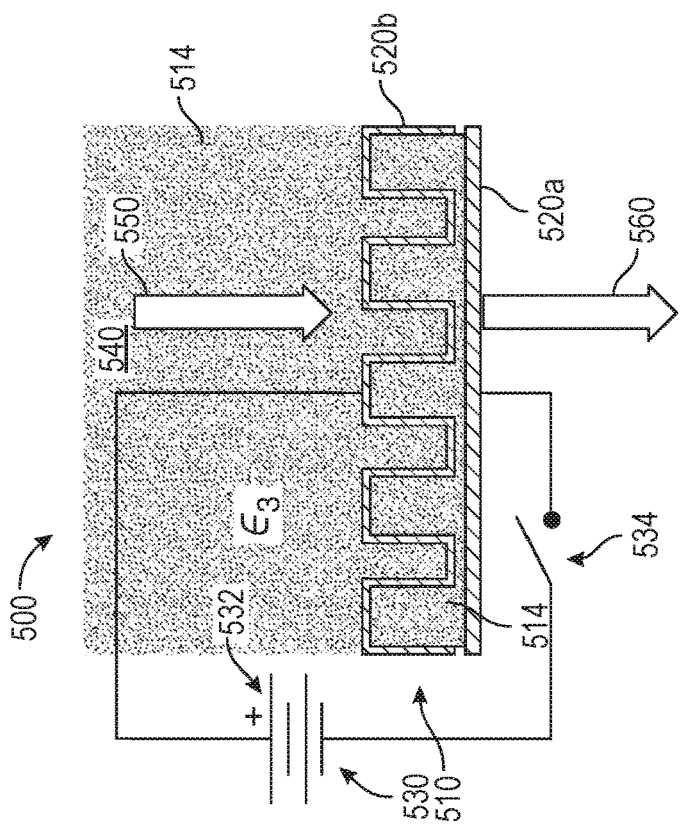
FIG. 5B
FIG. 5A

NANOVOIDED TUNABLE BIREFRINGENCE

CROSS-REFERENCE TO RELATED APPLICATION

This application claims the benefit of priority under 35 U.S.C. § 119(e) of U.S. Provisional Application No. 62/777,825, filed Dec. 11, 2018, the contents of which are incorporated herein by reference in their entirety.

BACKGROUND

Polymer materials may be incorporated into a variety of different optic and electro-optic architectures, including active and passive optics and electroactive devices. Electroactive polymer (EAP) materials, for instance, may change their shape under the influence of an electric field. EAP materials have been investigated for use in various technologies, including actuation, sensing, and energy harvesting. Lightweight and conformable, electroactive polymers may be incorporated into wearable devices such as haptic devices and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including their electrical, mechanical, and/or optical properties. Notwithstanding recent developments, it would be advantageous to provide polymer or other dielectric materials having improved attributes, including dynamic, tunable optical properties.

SUMMARY

As will be described in greater detail below, the instant disclosure relates to optical elements and methods of manufacturing optical elements that include nanovoided polymer materials. The nanovoided polymer materials may include electroactive materials, such as dielectric elastomers suitable for use in electroactive devices including, for example, polydimethylsiloxane (PDMS)-based polymers. Actuation of the nanovoided polymer materials may be used to reversibly control the size and shape of nanovoids within the polymer matrix and thereby modify the effective refractive index of the nanovoided polymer. In certain embodiments, an optical element may include a structured layer of a nanovoided polymer material. Actuation of the nanovoided polymer within the structured layer may be used to control the form birefringence of one or more layers within the optical element. In accordance with some embodiments, switchable optical elements exhibit a form birefringence that may be tuned during the operation thereof.

A form birefringent optical element includes a structured layer and a dielectric environment disposed over the structured layer. At least one of the structured layer and the dielectric environment includes a nanovoided polymer, the nanovoided polymer having a first refractive index in an unactuated state and a second refractive index different than the first refractive index in an actuated state. Actuation of the nanovoided polymer can be used to reversibly control the birefringence of the optical element.

In some embodiments, the structured layer includes a grating having a period in at least one dimension of less than $\lambda/5$, where $\lambda$ is the wavelength of light incident on the optical element. In one example embodiment, the structured layer includes the nanovoided polymer and the dielectric environment includes air. In a further example embodiment, the structured layer includes a substantially dense polymer and the dielectric environment includes the nanovoided polymer. In an alternate embodiment, the structured layer includes the nanovoided polymer and the dielectric environment includes a substantially dense polymer. In a still further embodiment, the structured layer and the dielectric environment each include the nanovoided polymer.

In some embodiments, the first refractive index may be equal to the refractive index of the dielectric environment. In some embodiments, the second refractive index may be equal to a refractive index of the dielectric environment.

According to further embodiments, a form birefringent optical element includes a structured layer, a dielectric environment disposed over, e.g., directly over, the structured layer, a primary electrode, and a secondary electrode overlapping at least a portion of the primary electrode. In the foregoing structure, at least one of the structured layer and the dielectric environment includes a nanovoided polymer layer wherein the nanovoided polymer layer is disposed between and abutting the primary electrode and the secondary electrode.

According to some embodiments, a method of manufacturing a form birefringent optical element includes forming a primary electrode, forming a structured layer over the primary electrode, forming a dielectric layer over the structured layer, and forming a secondary electrode. In such embodiments, at least one of the structured layer and the dielectric layer may include a nanovoided polymer such that the nanovoided polymer is disposed between and abuts both the primary electrode and the secondary electrode. In some embodiments, the secondary electrode may be formed directly over the structured layer.

In certain embodiments, light may be shined on the structured layer, where the structured layer includes a grating having a period in at least one dimension of less than $\lambda/5$, where $\lambda$ is the wavelength of the light. In still further embodiments, a voltage may be applied between the primary electrode and the secondary electrode.

Features from any of the these or other embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 2A is a schematic diagram showing an optical element having a structured polymer layer that includes a nanovoided polymer material according to some embodiments.

FIG. 2B is a schematic diagram of the optical element of FIG. 2A following capacitive actuation and compression of the structured polymer layer and showing the resulting change in the birefringence of light passing through the optical element according to certain embodiments.

FIG. 5A is a schematic diagram of an optical element having a structured polymer layer that includes a nanovoided polymer material and a polymer layer overlying the structured polymer layer that also includes a nanovoided polymer material according to some embodiments.

FIG. 5B is a schematic diagram showing the change in the light passing through the birefringent optical element of FIG. 5A following capacitive actuation and compression of the structured layer of nanovoided polymer material according to some embodiments.

Figure 1:
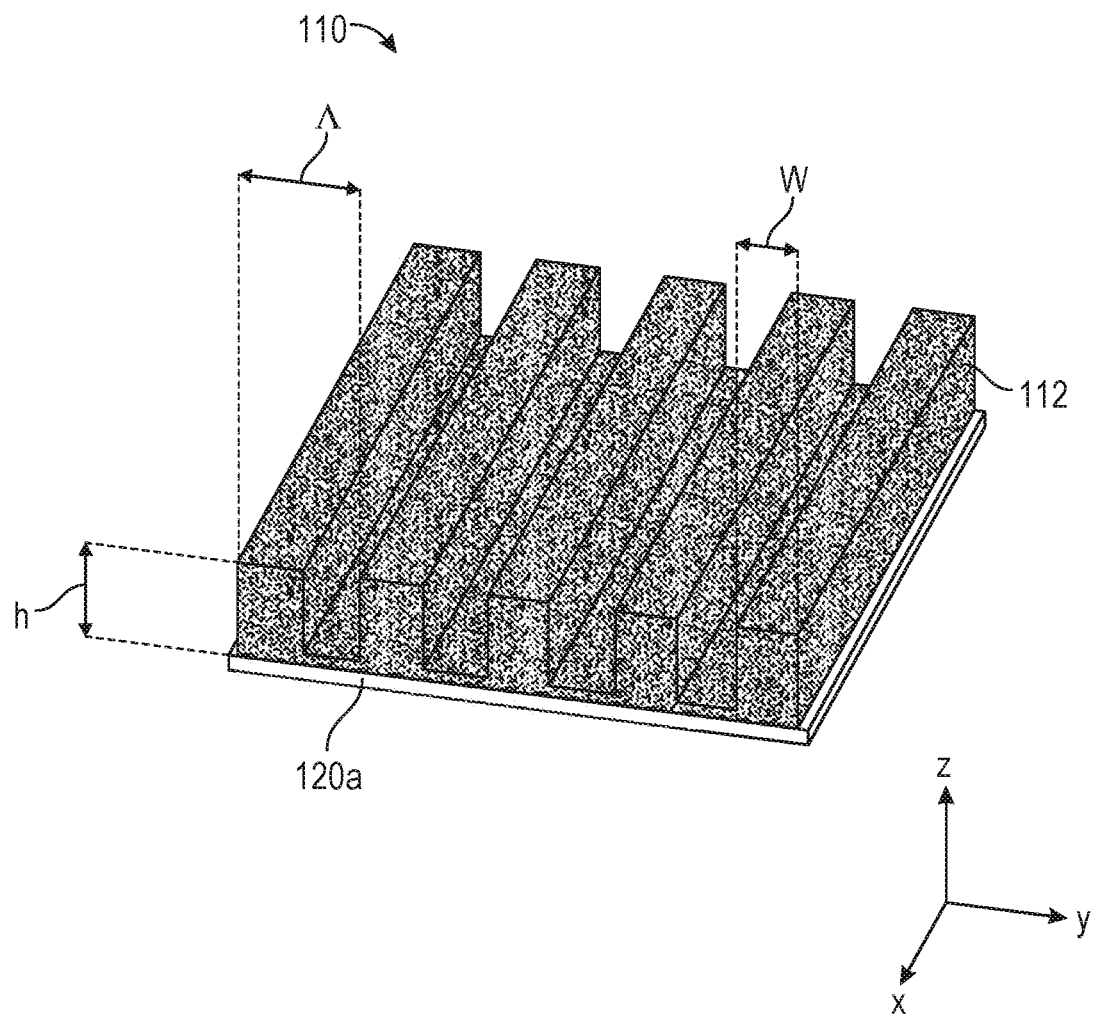
FIG. 1 is a schematic diagram showing a structured polymer layer according to various embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to optical elements that include a nanovoided polymer layer. In some examples, an "optical element" may include a structured article configured to interact with light, and may include, without limitation, refractive optics, reflective optics, dispersive optics, polarization optics, or diffractive optics. The nanovoided polymer layer may be incorporated into a structured layer and/or into an overlying dielectric layer located adjacent to a structured layer. A "structured layer" may, in some examples, include a dielectric layer having features, i.e., periodic features, with a characteristic dimension (l) in at least one direction that is less than the wavelength ($\lambda$) of light that interacts with the optical element, e.g., $l<0.5\lambda$, $l<0.2\lambda$ or even $l<0.1\lambda$.

According to some embodiments, the nanovoided polymer may be actuated to control the size and shape of the voids within the polymer matrix. Control of the void geometry, as well as the overall geometry of a nanovoided polymer layer, can be used to control the form birefringence of the optical element. For instance, a nanovoided polymer layer may have a first effective refractive index in an unactuated state and a second effective refractive index different than the first refractive index in an actuated state. The relative change in the refractive indices between the structured layer and the adjacent dielectric layer may induce a change in the form birefringence of the optical element.

In contrast to traditional optical materials that may have either a static index of refraction or an index that can be switched between two static states, nanovoided polymers represent a class of optical materials where the index of refraction can be tuned over a range of values to advantageously control the interaction of these materials with light.

Furthermore, in most traditional optical materials the index of refraction is uniform and independent of the direction of light propagation through the material. In birefringent materials, however, the index of refraction depends on the polarization and propagation direction of light. This classical, bulk optical anisotropy may be caused by an anisotropic dielectric response within the material, which may give rise to a phase retardation in one orientation with respect to another.

Independent of the foregoing bulk birefringence, "form birefringence" may arise from the interaction of light with an optical layer having a particular geometry and/or structure. Form birefringence may be observed in multi-phase or multi-component systems, for example, where the constituent phases or components have different refractive indices, the dimensional scale of the phases or components is of the order of the wavelength of light, and at least one of the phases or components has an anisotropic shape. Typically, form birefringence may be realized in an optical element having structural periodicity that occurs over dimensions between atomic length scales and 10 to 20% of the wavelength of light.

Thus, according to some embodiments, a periodic structural variation in the optical material may give rise to form birefringence. For instance, as described in various embodiments herein, an example periodic architecture may include a regular grating, such as a rectangular grating, although the principles disclosed herein may be extended to any structure having a periodic dielectric variation where form birefringence is applicable.

Without wishing to be bound by theory, various mathematical methods may be used to evaluate form birefringence, including but not limited to effective medium theory (EMT), rigorously coupled waveguide analysis (RCWA), finite difference time domain (FDTD), or finite element modeling (FEM). In the case of EMT, for instance, it may be shown that the anisotropic dielectric properties of a periodic rectangular grating may be represented as a $2^{nd}$ order solution as follows:

$$\epsilon_{0,E\perp K} = F\epsilon_1 + (1-F)\epsilon_3;$$

$$\epsilon_{0,E\|K} = \frac{\epsilon_1\epsilon_3}{F\epsilon_1 + (1-F)\epsilon_3};$$

-continued $$\epsilon_{2,E\perp K} = \epsilon_{0,E\perp K} + \frac{1}{3}\left(\frac{\Lambda}{\lambda}\right)^2 \pi^2 F^2 (1-F)^2 (\epsilon_1 - \epsilon_3)^2; \text{ and}$$

$$\epsilon_{2,E\|K} = \epsilon_{0,E\perp K} + \frac{1}{3}\left(\frac{\Lambda}{\lambda}\right)^2 \pi^2 F^2 (1-F)^2 \left(\frac{1}{\epsilon_1} - \frac{1}{\epsilon_3}\right)^2 \times \epsilon_{0,E\|K}^3 \epsilon_{0,E\perp K}$$

where $\epsilon_{0,E\perp K}$ and $\epsilon_{0,E\|K}$ are the $0^{th}$ order effective dielectric constants of the grating material with an electric field polarized perpendicular and parallel to the gratings, respectively; $\epsilon_{2,E\perp K}$ and $\epsilon_{2,E\|K}$ are the corresponding $2^{nd}$ order effective dielectric constants; $\epsilon_1$ and $\epsilon_3$ are the bulk dielectric constants of the grating material and the adjacent dielectric environment, respectively; F is the fill fraction of the grating material; $\Lambda$ is the period of the grating; and $\lambda$ is the wavelength of light. In comparative architectures, these indices of refraction for birefringent materials are temporally invariant for both the grating element and the adjacent environment.

In view of the foregoing, and in accordance with various embodiments, disclosed are methods of forming an optical element as well as corresponding architectures that incorporate a structured layer and an adjacent dielectric environment where one or both of the structured layer and the dielectric environment have a tunable refractive index. That is, one or both of the structured layer and the dielectric environment may include a nanovoided polymer. Such an architecture can beneficially enable dynamic control of form birefringence and increase the range of performance of the optical element.

In accordance with various embodiments, a nanovoided polymer material may include a polymer matrix and a plurality of nanoscale voids dispersed throughout the matrix. The polymer matrix material may include a deformable, electroactive polymer that may be symmetric with regard to electrical charge (e.g., polydimethylsiloxane (PDMS), acrylates, etc.) or asymmetric (e.g., poled polyvinylidene fluoride (PVDF) or its co-polymers such as poly(vinylidene-fluoride-co-trifluoroethylene) (PVDF-TrFE)). Such materials, according to some embodiments, may have a dielectric constant or relative permittivity, such as, for example, a dielectric constant ranging from approximately 1.2 to approximately 30.

In some examples, the terminology "nanovoids," "nanoscale voids," "nanovoided," and the like, may refer to voids having at least one sub-micron dimension, i.e., a length and/or width and/or depth, of less than 1000 nm. In some embodiments, the void size may be between approximately 10 nm and approximately 1000 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, or approximately 1000 nm, including ranges between any of the foregoing values).

In example nanovoided polymers, the nanovoids may be randomly distributed throughout the polymer matrix, without exhibiting any long-range order, or the nanovoids may exhibit a regular, periodic structure having a lattice constant of approximately 20 nm to approximately 1000 nm. In both disordered and ordered structures, the nanovoids may be discrete, closed-celled voids, open-celled voids that may be at least partially interconnected, or combinations thereof. For open-celled voids, the void size (d) may be the minimum average diameter of the cell. The voids may be any suitable size and, in some embodiments, the voids may approach the scale of the thickness of the nanovoided polymer layer.

In certain embodiments, the nanovoids may occupy approximately 10% to approximately 90% by volume of the nanovoided polymer matrix, e.g., approximately 10%, approximately 20%, approximately 30%, approximately 40%, approximately 50%, approximately 60%, approximately 70%, approximately 80%, or approximately 90%, including ranges between any of the foregoing values.

According to some embodiments, the nanovoids may be substantially spherical, although the void shape is not particularly limited. For instance, in addition to, or in lieu of spherical voids, the nanovoided polymer material may include voids that are oblate, prolate, lenticular, ovoid, etc., and may be characterized by a convex and/or a concave cross-sectional shape. Moreover, the topology of the voids throughout the polymer matrix may be uniform or non-uniform. As used herein "topology" with reference to the nanovoids refers to their overall arrangement within the nanovoided polymer and may include their size and shape as well as their respective distribution (density, periodicity, etc.) throughout the polymer matrix. By way of example, the size of the voids and/or the void size distribution may vary spatially within the nanovoided polymer material, i.e., laterally and/or with respect to a thickness of the nanovoided polymer material.

In the presence of an electrostatic field (E-field), an electroactive polymer may deform (e.g., compress, elongate, bend, etc.) according to the magnitude and direction of the applied field. Generation of such a field may be accomplished, for example, by placing the electroactive polymer between two electrodes, i.e., a primary electrode and a secondary electrode, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

The physical origin of the compressive nature of electroactive polymers in the presence of an electrostatic field, being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material. Compliance in this case is the change of strain with respect to stress or, equivalently, in more practical terms, the change in displacement with respect to force.

In some embodiments, applying a voltage to the electrodes (e.g., the primary electrode and/or the secondary electrode) may create at least approximately 0.1% strain (e.g., an amount of deformation in the direction of the applied force resulting from the applied voltage divided by the initial dimension of the material) in the nanovoided polymer material in at least one direction (e.g., an x, y, or z direction with respect to a defined coordinate system).

In some embodiments, the nanovoids may be at least partially filled with a gas to suppress electrical breakdown of the electroactive polymer element (for example, during capacitive actuation). The gas may include air, nitrogen, oxygen, argon, sulfur hexafluoride, an organofluoride and/or any other suitable gas. In some embodiments, such a gas may have a high dielectric strength.

In some embodiments, the application of a voltage to a nanovoided polymer layer may change the internal pressure of gasses within the nanovoided regions thereof. For example, gasses may diffuse either into or out of the nanovoided polymer matrix during dimensional changes associated with its deformation. Such changes in the electroactive polymer elements can affect, for example, the hysteresis of an electroactive device incorporating the electroactive polymer during dimensional changes, and also may result in drift when the nanovoided polymer layer's dimensions are rapidly changed.

In some embodiments, the nanovoided composite polymer material may include an elastomeric polymer matrix having an elastic modulus of less than approximately 10 GPa (e.g., approximately 10 GPa, approximately 5 GPa, approximately 2 GPa, approximately 1 GPa, approximately 0.5 GPa, approximately 0.2 GPa, approximately 0.1 GPa, or approximately 0.05 GPa, including ranges between any of the foregoing values).

Polymer materials including voids having nanoscale dimensions may possess a number of advantageous attributes. For example, the incorporation of nanovoids into a polymer matrix may increase the permittivity of the resulting composite. Also, the high surface area-to-volume ratio associated with nanovoided polymers may provide a greater interfacial area between the nanovoids and the surrounding polymer matrix. With such a high surface area structure, electric charge can accumulate at the void-matrix interface, which can enable greater polarizability and, consequently, increased permittivity ($\varepsilon_r$) of the composite. Additionally, because ions, such as plasma electrons, can only be accelerated over small distances within nanovoids, the likelihood of molecular collisions that liberate additional ions and create a breakdown cascade is decreased, which may result in the nanovoided material exhibiting a greater breakdown strength than un-voided or even macro-voided dielectrics.

Various manufacturing methods may be used to form nanovoided polymer materials, such as nanovoided polymer thin films or structured layers. Methods of forming nanovoided polymer thin films or structured layers having randomly-distributed (i.e., disordered) voids include selectively depositing a polymer composition or a polymeric precursor composition to form voids in situ, or depositing a polymer or polymeric precursor composition containing a templating agent and then selectively removing the templating agent, while a thin film or structured layer having a regular (i.e., ordered) arrangement of voids may be formed by self-assembly or by using various lithography techniques.

In accordance with various embodiments, an example method for fabricating a nanovoided polymer may include (i) depositing a mixture including a curable material and at least one non-curable (e.g., non-polymeric) component onto a substrate, (ii) processing the mixture to form a cured polymer material including at least one non-polymeric component in a plurality of defined regions, and (iii) removing at least a portion of the at least one non-polymeric component from the cured polymer material to form a nanovoided polymer material on the substrate.

In some examples, depositing the mixture may include printing the mixture onto the substrate. Printing may include at least one of inkjet printing or silkscreen printing, for example. In some examples, processing the mixture may include curing the curable material to form the cured polymer material. A curing source and/or heat source, for example, may be used to process the mixture and may include an energized array of filaments that may generate actinic energy to heat the curable material. In some embodiments, removing at least the portion of the at least one non-polymeric component from the cured polymer material may lead to the formation of a plurality of voids defined in the nanovoided polymer material.

In some embodiments, the at least one non-curable component may include a solvent. The curable material may include at least one of an acrylate, a styrene, a polyester, a polycarbonate, an epoxy, a halogenated polymer, or a silicone material, as well as mixtures thereof. Further, processing the mixture may include curing the curable material to form the cured polymer material, the cured polymer material including the solvent in the plurality of defined regions. Moreover, removing at least a portion of the at least one non-polymeric component from the cured polymer material may include removing at least a portion of the solvent from the cured polymer material to form the nanovoided polymer material on the electrode.

In some examples, the at least one non-curable component may include a cavitation agent. Further, processing the mixture may include exposing the mixture to light sufficient to cure the curable material and decompose the cavitation agent to form the cured polymer material, the cured polymer material including at least one decomposition product of the cavitation agent in the plurality of defined regions. Further, removing at least the portion of the at least one non-polymeric component from the cured polymer material may include removing at least a portion of the at least one decomposition product from the cured polymer material.

In various embodiments, a method for fabricating a nanovoided polymer may include vaporizing a curable material and depositing the vaporized curable material onto a substrate. The method may further include (i) combining the curable material with at least one non-curable component to form a mixture including the curable material and the at least one non-curable component on the substrate, (ii) processing the mixture to form a cured polymer material including at least one non-polymeric component in a plurality of defined regions, and (iii) removing at least a portion of the at least one non-polymeric component from the cured polymer material to form a nanovoided polymer material on the substrate. In some embodiments, removing at least the portion of the at least one non-polymeric component from the cured polymer material may form a plurality of voids defined in the nanovoided polymer material.

Moreover, (i) vaporizing the curable material may include vaporizing the curable material in a vaporizer, and (ii) depositing the vaporized curable material onto the substrate may include depositing the vaporized curable material while continuously changing the position of the substrate with respect to the vaporizer.

In some embodiments, the at least one non-curable component may include a solvent. Further, processing the mixture may include (i) curing the curable material to form the cured polymer material, the cured polymer material including the solvent in the plurality of defined regions, and (ii) removing at least the portion of the at least one non-polymeric component from the cured polymer material may include removing at least a portion of the solvent from the cured polymer material to form the nanovoided polymer material on the substrate.

In another aspect, the at least one non-curable component may include a cavitation agent. Further, processing the mixture may include exposing the mixture to light sufficient to cure the curable material and decompose the cavitation agent to form the cured polymer material, the cured polymer material including at least one decomposition product of the cavitation agent in the plurality of defined regions. In this example, removing at least the portion of the at least one non-polymeric component from the cured polymer material may include removing at least a portion of the at least one decomposition product from the cured polymer material.

In some embodiments, the application of a voltage to a nanovoided polymer layer may change the topology of the voids within the polymer. In accordance with various embodiments, the manipulation of the nanovoid topology can be used to actively control the effective refractive index of the nanovoided polymer layer and hence the form birefringence of a structured nanovoided polymer layer. In this vein, as used herein, an "effective refractive index" for a composite material such as a nanovoided polymer is not an inherent material property but may be determined using effective medium approximations.

As will be explained in greater detail below, embodiments of the instant disclosure relate to switchable optical elements that include a nanovoided polymer layer. For instance, the nanovoided polymer layer may exhibit a first refractive index in an unactuated state and a second refractive index different than the first refractive index in an actuated state. Capacitive actuation, mechanical actuation, or actuation of the nanovoided polymer layer by other methods, such as using an acoustic wave, may be used to reversibly manipulate the void topology and hence the from birefringence of the device.

Figure 6:
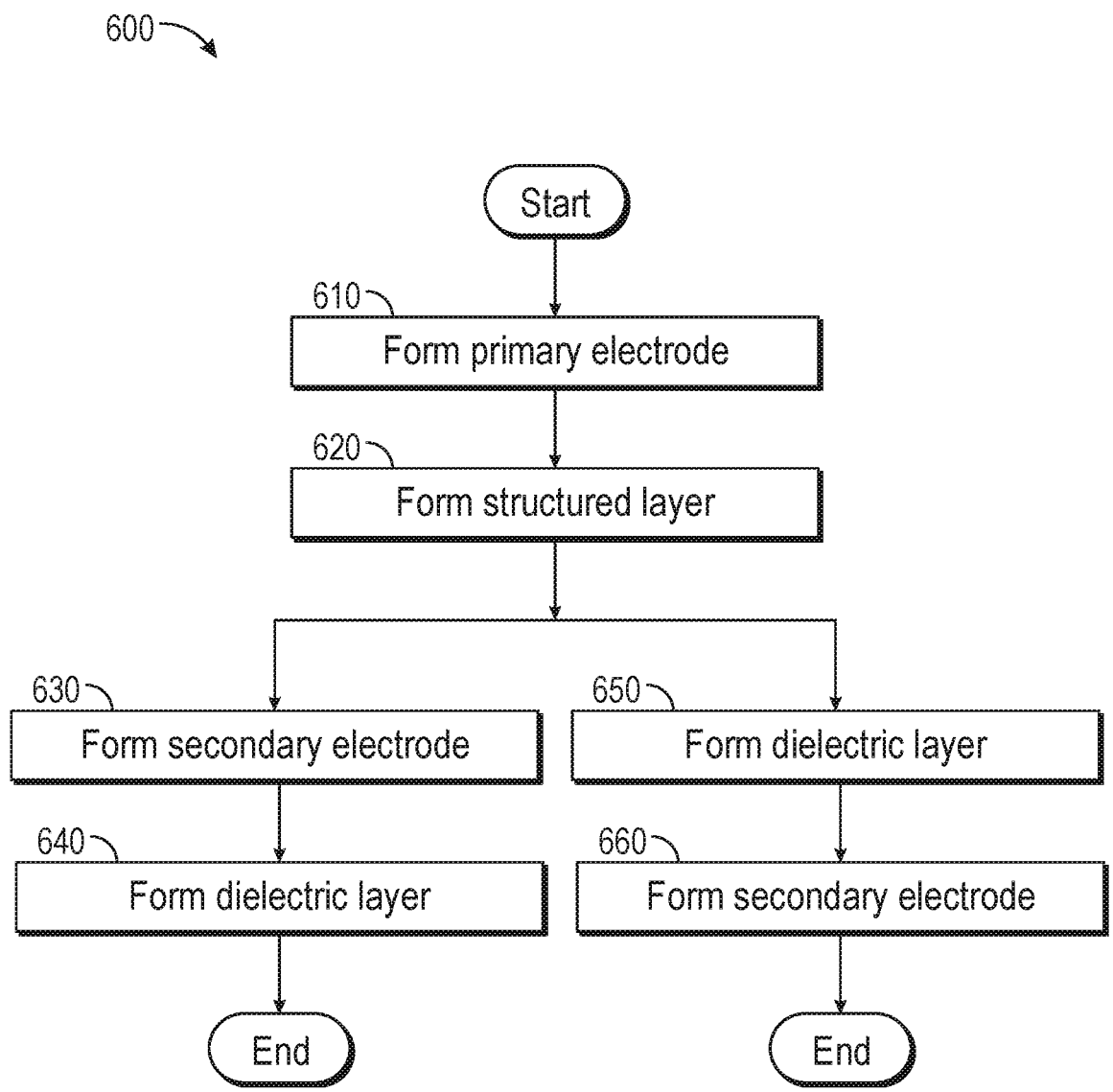
FIG. 6 is a flowchart illustrating an example method of forming an optical element.

The following will provide, with reference to FIGS. 1-6, a detailed description of methods and systems related to the manufacture and implementation of optical elements having tunable birefringence. The discussion associated with FIG. 1 includes a description of an example grating structure including a structured layer that may include a nanovoided polymer, and a dielectric layer adjacent to the structured layer. The discussion associated with FIGS. 2A-5B includes a description of the effect of capacitive actuation on the form birefringence of optical elements that include a nanovoided polymer layer and an adjacent dielectric layer. With reference to FIG. 6, described are example methods of forming optical elements having tunable birefringence.

Referring to FIG. 1, a structured layer 110 is disposed over a substrate (not shown). In accordance with various embodiments, and as will be appreciated by those skilled in the art, the structured layer 110 may form part of a surface grating or a volume grating. A primary electrode 120a may be formed over the substrate and the structured layer 110 may be formed over, e.g., directly over, the primary electrode 120a. The substrate, if provided, may be an optically transparent substrate such as a glass substrate, for example. The example structured layer 110 includes a grating having a regular array of elements 112 each having a rectangular cross-section. In some embodiments, elements 112 may have an aspect ratio (h/w) of approximately 2 to approximately 10, e.g., approximately 2, approximately 4, approximately 6, approximately 8 or approximately 10, including ranges between any of the foregoing values. The core material making up the elements 112 within the structured layer 110 may include any suitable dielectric material and, in accordance with certain embodiments, may include a dielectric material such as a nanovoided polymer or a substantially un-voided, i.e., dense, polymer. In some examples, a "substantially dense" polymer layer has a density of at least approximately 95% of a theoretical density of the polymer(s) constituting the polymer layer, e.g., approximately 95%, approximately 98%, approximately 99%, approximately 99.5%, or approximately 100%, including ranges between any of the foregoing values.

According to example embodiments, height (h) and the width (W) the elements 112 within the grating may be independently selected from approximately 10 nm to approximately 10 μm, e.g., approximately 10 nm, approximately 20 nm, approximately 50 nm, approximately 100 nm, approximately 200 nm, approximately 500 nm, approximately 1000 nm, approximately 5000 nm, or approximately 10000 nm, including ranges between any of the foregoing values.

In example embodiments, the grating elements 112 may be arrayed with a regular period (Λ), which may be within a range of less than approximately 10 nm to approximately 20 μm, e.g., approximately 10 nm, approximately 20 nm, approximately 50 nm, approximately 100 nm, approximately 200 nm, approximately 500 nm, approximately 1000 nm, approximately 2000 nm, approximately 5000, approximately 10000, or approximately 20000 nm, including ranges between any of the foregoing values, although smaller and larger periodicities may be used. In some examples, the term "period" may refer to the sum of an element width and the spacing between adjacent elements. As will be appreciated, the element dimensions and local geometry may be selected to provide a desired amount of form birefringence.

In accordance with various embodiments, a nanovoided polymer layer is disposed between a primary electrode and a secondary electrode, which may enable capacitive actuation of the nanovoided polymer layer. According to some embodiments, an optical element may include a primary electrode, a secondary electrode overlapping at least a portion of the primary electrode, and a nanovoided polymer layer disposed between and abutting the primary electrode and the secondary electrode.

The application of a voltage between the electrodes can cause compression of the nanovoided polymer layer in the direction of the applied electric field and an associated expansion or contraction of the nanovoided polymer layer in one or more transverse dimensions. Such actuation can be used to manipulate the topology of nanovoids within the polymer matrix and, in turn, the effective refractive index and form birefringence of the layers within the optical element.

Referring to FIG. 2A, an example optical element 200 includes a structured polymer layer 210. The structured layer may have a non-planar geometry and, in the illustrated embodiment of FIG. 2A and FIG. 2B, may include a plurality of elements 212 arrayed over a substrate (not shown). The structured layer 210 may include a grating and may be formed over a primary electrode 220a by selective deposition of a suitable polymer material or by using a patterning technique such as photolithography. In various embodiments, the structured layer 210 may include a nanovoided polymer 214 or a substantially un-voided polymer.

The nanovoided polymer 214 may be disposed over, e.g., directly over, the primary electrode 220a, and a secondary electrode 220b may be disposed over, e.g., directly over, the nanovoided polymer 214. In some embodiments, the electrodes (e.g., the primary electrode 220a and the secondary electrode 220b may include metals such as aluminum, gold, silver, tin, copper, indium, gallium, zinc, and the like. Other conductive materials may be used, including carbon nanotubes, graphene, transparent conductive oxides (TCOs, e.g., indium tin oxide (ITO), zinc oxide (ZnO), etc.), and the like.

The electrodes (e.g., the primary electrode 220a and the secondary electrode 220b) may be fabricated using any suitable process. For example, the electrodes may be fabricated using physical vapor deposition (PVD), chemical vapor deposition (CVD), evaporation, spray-coating, spin-coating, atomic layer deposition (ALD), and the like. In further aspects, the electrodes may be manufactured using a thermal evaporator, a sputtering system, a spray coater, a spin-coater, printing, stamping, and the like. In some embodiments, the primary and secondary electrodes 220a, 220b may be conformally disposed over respective lower and upper surfaces of the nanovoided polymer 214.

In some embodiments, the electrodes (e.g., the primary electrode 220a and the secondary electrode 220b) may have a thickness of approximately 1 nm to approximately 1000 nm, with an example thickness of approximately 10 nm to approximately 50 nm. The electrodes in certain embodiments may have an optical transmissivity of at least approximately 50%, e.g., approximately 50%, approximately 60%, approximately 70%, approximately 80%, approximately 90%, approximately 95%, approximately 97%, approximately 98%, or approximately 99%, including ranges between any of the foregoing values.

Some of the electrodes may be designed to allow healing of electrical breakdown (e.g., associated with the electric breakdown of elastomeric polymer materials). A thickness of an electrode that includes a self-healing electrode (e.g., an aluminum electrode) may be approximately 20 nm. The electrodes may be configured to stretch elastically. In such embodiments, the electrodes may include TCOs, graphene, carbon nanotubes, and the like. In other embodiments, relatively rigid electrodes (e.g. electrodes including a metal such as aluminum) may be used.

A control circuit 230 including a voltage source 232 and a switch 234 may be configured to apply an electrical bias to the structured layer 210 via electrodes 220a, 220b. As shown in FIG. 2A, with switch 234 open and structured layer 210 unbiased, incident light 250 directed at the optical element 200, i.e., at structured layer 210, may pass through a dielectric environment 240 proximate to the structured layer 210 (e.g., a dielectric medium, such as air overlying the secondary electrode 220b) prior to passing through structured layer 210 and exiting as output light 260.

Referring still to FIG. 2A, the incident light 250 may experience the bulk dielectric constant ($\varepsilon_3$) of the dielectric environment 240 and, depending upon its polarization and propagation direction, two different dielectric constants ($\varepsilon_1$ and $\varepsilon_2$) associated with the structured layer 210. In the illustrated embodiment, $\varepsilon_1$ is the bulk dielectric constant of the nanovoided polymer material 214, i.e., along a length direction (i.e., x-direction) of elements 212, and $\varepsilon_2$ is the effective dielectric constant along a transverse direction (i.e., y-direction).

In various embodiments, the structured layer (SL) to dielectric environment (DL) index contrast ($n_{SL}-n_{DE}$) may be at least approximately 0.05, e.g., approximately 0.05, approximately 0.1, approximately 0.2, or approximately 0.5, including ranges between any of the foregoing values.

Referring to FIG. 2B, nanovoided polymer 214 within structured layer 210 may be actuated using electrostatic force by closing switch 234. In response to actuation and the attendant compression of the nanovoided polymer 214, the void volume within the nanovoided polymer 214 may change (e.g., decrease), which may change the effective refractive index of the nanovoided polymer 214 and hence the form birefringence of the optical element 200. As shown in FIG. 2B, following actuation and the formation of dense polymer layer 216, dielectric constants $\varepsilon_1$ and $\varepsilon_2$ may independently increase or decrease to attain actuated values $\varepsilon_1'$ and $\varepsilon_2'$, respectively. Moreover, by re-opening switch 234, incident light 250 may again experience unactuated dielectric constants $\varepsilon_1$ and $\varepsilon_2$ (FIG. 2A). Thus, according to various embodiments, actuation of the nanovoided polymer 214 can be used to reversibly manipulate the interaction of light with optical element 200 and provide continuous birefringence tuning.

Figure 3B:
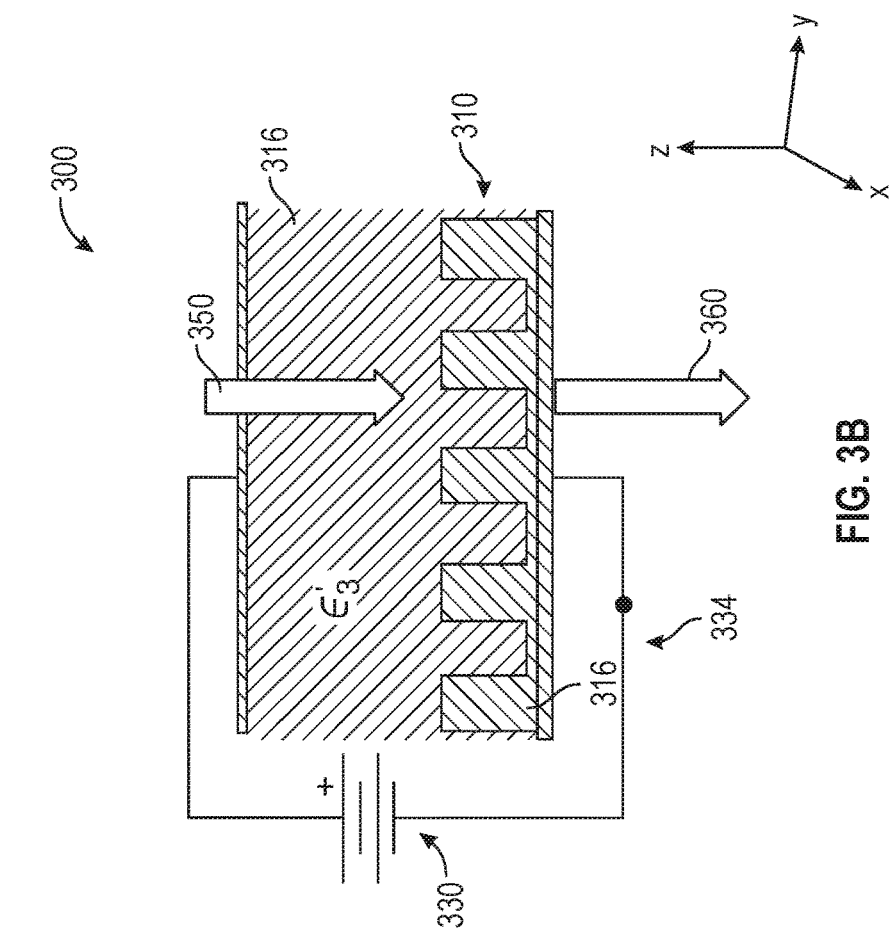
FIG. 3B is a schematic diagram of the optical element of FIG. 3A following capacitive actuation and compression of the overlying nanovoided polymer layer and the attendant change in the light passing through the birefringent optical element according to certain embodiments.
Figure 3A:
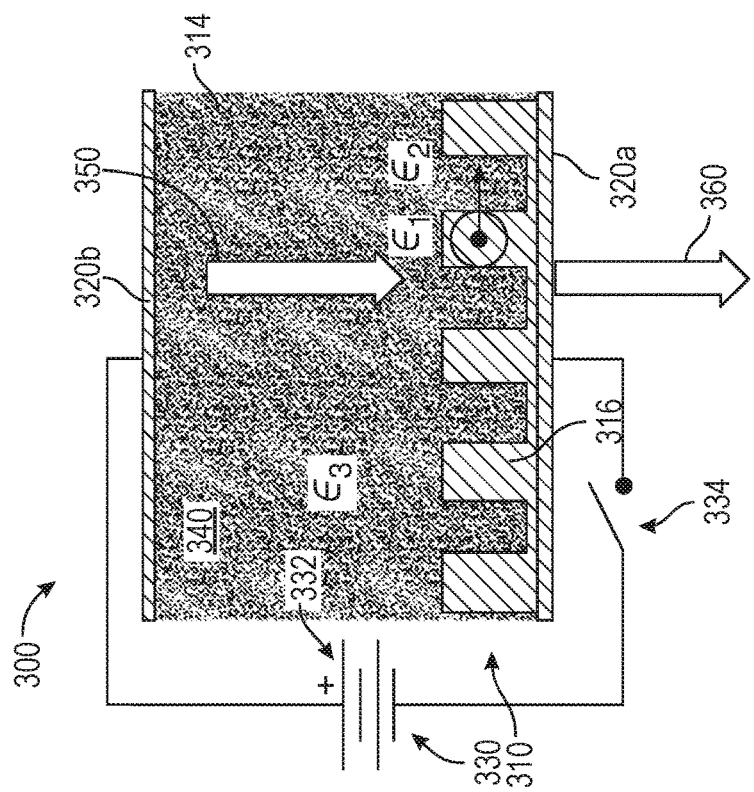
FIG. 3A is a schematic diagram showing an optical element having a structured polymer layer and a dielectric layer overlying the structured polymer layer that includes a nanovoided polymer material according to some embodiments.

Referring to FIG. 3A and FIG. 3B, illustrated is a further example of a switchable optical element. Optical element 300 includes a structured polymer layer 310, which may include an un-voided (substantially dense) polymer 316. Optical element 300 may further include a dielectric environment 340 disposed over, e.g., directly over the structured dense polymer layer 316. Dielectric environment 340 may include, for example, a nanovoided polymer layer 314. As shown, the nanovoided polymer 314 may be disposed over a primary electrode 320a, and a secondary electrode 320b may be disposed over the nanovoided polymer 314. In some embodiments, primary electrode 320a may be disposed conformally over the structured polymer layer 310, i.e., directly over dense polymer layer 316. Control circuit 330, including a voltage source 332 and a switch 334, is configured to apply an electrical bias to the nanovoided polymer layer 314.

Referring to FIG. 3A, with switch 334 open and nanovoided polymer layer 314 unbiased, incident light 350 directed at the optical element 300, i.e., at structured layer 310, may experience the bulk dielectric constant ($\varepsilon_3$) of the dielectric environment 340 and, depending upon the polarization and propagation direction of the incident light 350, two different dielectric constants ($\varepsilon_1$ and $\varepsilon_2$) associated with the structured layer 310, where $\varepsilon_1$ is the bulk dielectric constant of the nanovoided polymer material 314, i.e., along a length direction (i.e., x-direction) of the grating elements, and $\varepsilon_2$ is the dielectric constant along a transverse direction (i.e., y-direction).

By closing switch 334, a voltage may be applied across the nanovoided polymer layer 314 and the nanovoided polymer 314 may be compressed by electrostatic forces between the primary and secondary electrodes 320a, 320b. In the embodiment illustrated in FIG. 3B, compression of the nanovoids and the resulting compaction of the nanovoided polymer 314 may form a substantially dense polymer layer 316 having a uniform refractive index (and uniform bulk dielectric constant $\varepsilon_3$) between the electrodes 320a, 320b such that no birefringence is observed in the output light 360.

As will be appreciated, in the embodiment illustrated in FIGS. 3A and 3B, under compression, the effective refractive index of the nanovoided polymer 314 may be tuned to match the refractive index of the dense polymer layer 316. In this regard, in some embodiments, the polymer composition of the nanovoided polymer layer 314 may be substantially the same as the polymer composition of the dense polymer layer 316, which may facilitate index-matching. In additional examples, the composition of the dense polymer layer 316 may differ from the matrix composition of the nanovoided polymer layer 314.

Figure 4B:
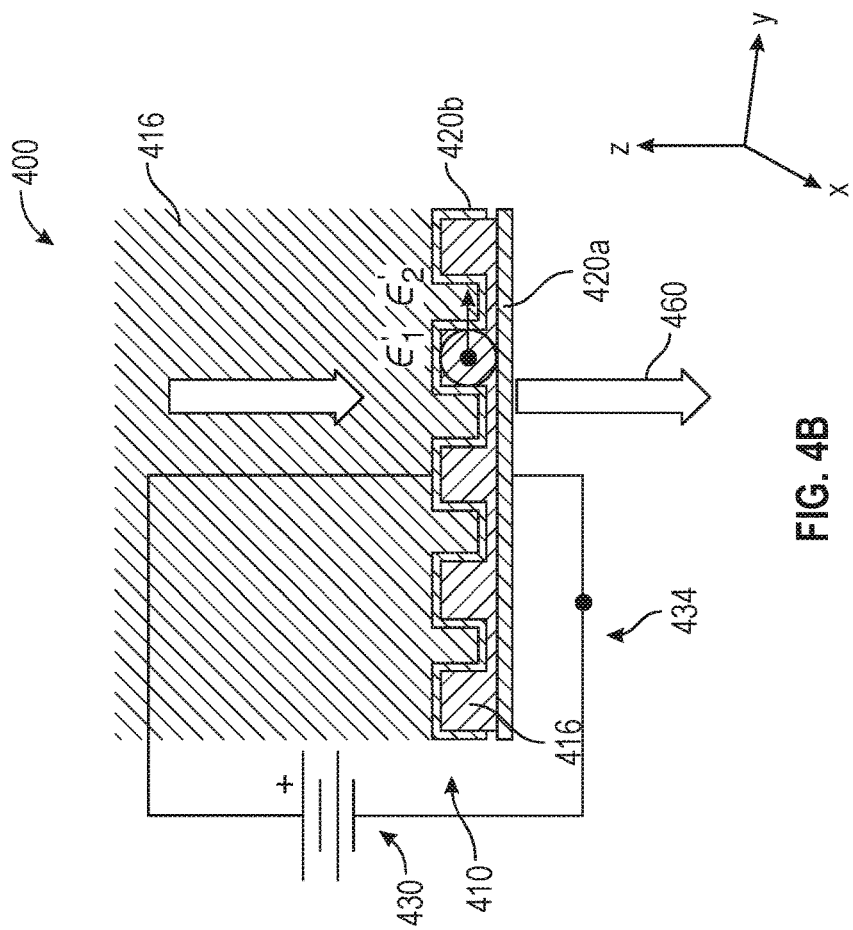
FIG. 4B is a schematic diagram showing the change in the light passing through the birefringent optical element of FIG. 4A following actuation and compression of the structured layer of nanovoided polymer material according to certain embodiments.
Figure 4A:
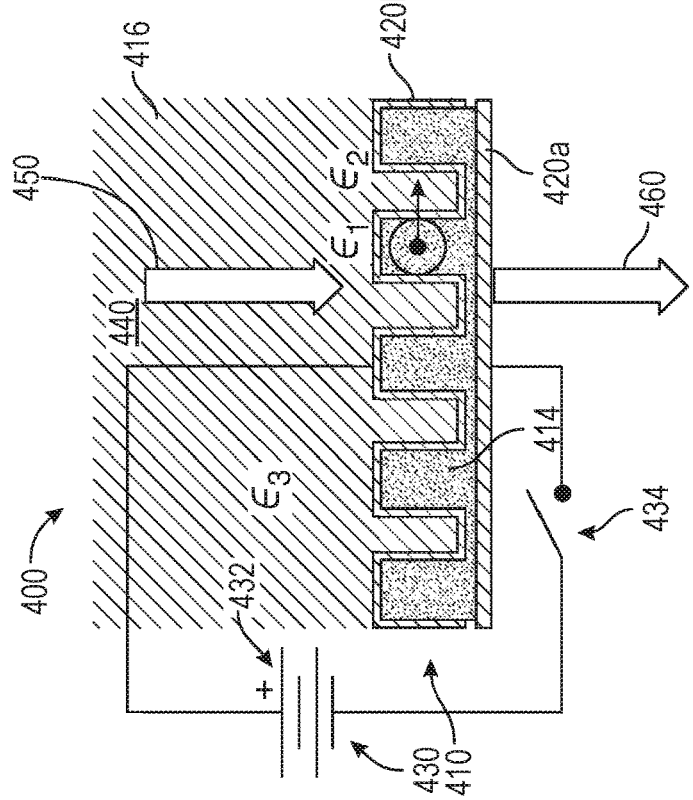
FIG. 4A is a schematic diagram showing an optical element having a structured polymer layer that includes a nanovoided polymer material and a dense polymer layer overlying the structured polymer layer according to some embodiments.

Illustrated in FIG. 4A and FIG. 4B is a switchable optical element according to further embodiments. Optical element 400 includes a structured polymer layer 410 disposed over a primary electrode 420a, and a secondary electrode 420b disposed over the structured polymer layer 410. The structured polymer layer 410 may include a nanovoided polymer 414, for example, where the primary electrode 420a and the secondary electrode 420b are each in direct contact with respective lower and upper surfaces of the nanovoided polymer 414.

Circuit 430, including a voltage source 432 and a switch 434, is configured to apply a voltage across the structured polymer layer 410 via electrodes 420a, 420b. Optical element 400 further includes a dielectric environment 440. Dielectric environment 440 may include a dense polymer layer 416 disposed over the structured polymer layer 410, i.e., directly over secondary electrode 420b.

Referring to FIG. 4A, with switch 434 open and nanovoided polymer layer 414 unbiased, incident light 450 directed at the optical element 400, i.e., at structured layer 410, may experience the bulk dielectric constant ($\varepsilon_3$) of the dielectric environment 440 and, depending upon the polarization and propagation direction of the incident light 450, two different dielectric constants ($\varepsilon_1$ and $\varepsilon_2$) associated with the structured layer 410, i.e., a bulk dielectric constant ($\varepsilon_1$) corresponding to the nanovoided polymer material 314 along a length direction (i.e., x-direction) of the grating elements, and an effective dielectric constant ($\varepsilon_2$) along a transverse direction (i.e., y-direction).

With reference to FIG. 4B, by closing switch 434, a voltage may be applied across the nanovoided polymer layer 414 and the nanovoided polymer 414 may be compressed by electrostatic forces between the primary and secondary electrodes 420a, 420b. Compression of the nanovoids and the resulting compaction of the nanovoided polymer 414 may form a substantially dense polymer layer 416 having a uniform refractive index between the electrodes 420a, 420b such that incident light 450 emerges from optical element 400 as output light 460 without exhibiting form birefringence. That is, in embodiments where the index of refraction of the actuated nanovoided polymer matches that of an overlying dense polymer layer, no form birefringence will be observed.

A still further example switchable optical element is illustrated schematically in FIG. 5A and FIG. 5B. Optical element 500 includes a structured polymer layer 510 disposed over a primary electrode 520a, and a secondary electrode 520b disposed over the structured polymer layer 510. The structured polymer layer 510 may include a nanovoided polymer 514, for example, where the primary electrode 520a and the secondary electrode 520b are each in direct contact with the nanovoided polymer 514.

Control circuit 530, including a voltage source 532 and a switch 534, is configured to apply a voltage across the structured polymer layer 510 via electrodes 520a, 520b. Optical element 500 further includes a dielectric environment 540 disposed over the structured polymer layer 510, i.e., directly over secondary electrode 520b. Dielectric environment 540 may include a nanovoided polymer layer 514. As shown in the un-actuated state of FIG. 5A, the nanovoided polymer within the structured layer 510 and the nanovoided polymer within the dielectric environment 540 may be index-matched such that input light 550 emerges from the optical element 500 as output light 560 without exhibiting birefringence.

With reference to FIG. 5B, by closing switch 534, a voltage may be applied across the nanovoided polymer layer 514 within structured layer 510 and the nanovoided polymer 514 may be compressed by electrostatic forces to form dense polymer layer 516 between the primary and secondary electrodes 520a, 520b. Compression of the nanovoids and the resulting compaction of the nanovoided polymer 514 may increase the effective refractive index within the structured layer 510 relative to the dielectric environment 540 such that form birefringence for optical element 500 may be turned on.

Referring to FIG. 6, illustrated is a flow chart showing example methods of forming optical elements having tunable birefringence. The process flow 600 in FIG. 6 includes the successive formation of various layers or structures. In step 610, a primary electrode may be formed, such as over a substrate, and in step 620, a structured layer may be formed over, e.g., directly over, the primary electrode. In some embodiments, as shown with reference to step 630, a secondary electrode may be formed over the structured layer and, as illustrated by step 640, a dielectric layer may be formed over the secondary electrode. In some embodiments, in lieu of forming the secondary electrode prior to forming the dielectric layer, the dielectric layer may be formed prior to forming the secondary electrode. That is, referring to step 650, the dielectric layer may be formed over, e.g., directly over, the structured layer and, as shown in step 660, the secondary electrode may be formed over the dielectric layer.

The foregoing embodiments illustrate example optical elements where a nanovoided polymer layer is capacitively actuated. As disclosed herein, various methods in addition to capacitive actuation may be used to actuate a nanovoided layer and thus impact its effective refractive index by manipulating the topology of the nanovoids therein. Mechanical compression, for instance, such as the application of a uniaxial force, may be used to physically actuate the nanovoided polymer layer.

The methods and systems shown and described herein may be used to form optical elements having a single layer or multiple layers of a nanovoided polymer. Each of a plurality of electrode/electroactive polymer element/electrode stacks, for example can be independently configured to have a desired void size and void size distribution, as well as shape, alignment, and spacing between layers. Such complex arrangements can enable dynamic, localized control of the form birefringence of an optical element.

Embodiments of the present disclosure may include or be implemented in conjunction with an artificial reality system. Artificial reality is a form of perceived reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in artificial reality and/or are otherwise used (e.g., perform activities) in artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A form birefringent optical element comprising:
a structured layer comprising a non-nanovoided polymer;
a dielectric environment disposed over the structured layer;
a primary electrode; and
a secondary electrode overlapping at least a portion of the primary electrode,
wherein:
the dielectric environment comprises a nanovoided polymer, the nanovoided polymer having a first refractive index in an unactuated state and a second refractive index different than the first refractive index in an actuated state;
the nanovoided polymer is disposed between the primary electrode and the secondary electrode;
the actuated state corresponds to an electric potential applied between the primary electrode and secondary electrode;
the second refractive index results from a compression of nanovoids in the nanovoided polymer by the electric potential in the actuated state; and
the dielectric environment and the structured layer are refractive index matched when the nanovoided polymer is in the actuated state.

2. The optical element of claim 1, wherein the structured layer comprises a grating having a period in at least one dimension of less than λ/5, where λ is a wavelength of light incident on the optical element.

3. The optical element of claim 1, wherein the structured layer comprises a substantially dense polymer.

4. The optical element of claim 1, wherein the first refractive index is equal to a refractive index of the dielectric environment.

5. The optical element of claim 1, wherein the second refractive index is equal to a refractive index of the dielectric environment.

6. The optical element of claim 1, wherein the nanovoided polymer is configured to have a higher refractive index in the actuated state due to the compression of the nanovoids in the nanovoided polymer.

7. The optical element of claim 1, wherein the nanovoided polymer abuts the primary electrode and the secondary electrode.

8. The optical element of claim 1, wherein the nanovoided polymer comprises a uniform void topology.

9. The optical element of claim 1, wherein the nanovoided polymer comprises a non-uniform void topology.

10. A form birefringent optical element comprising:
a structured layer comprising a non-nanovoided polymer;
a dielectric environment disposed over the structured layer;
a primary electrode; and
a secondary electrode overlapping at least a portion of the primary electrode;
wherein;
the dielectric environment comprises a nanovoided polymer layer and the nanovoided polymer layer is disposed between and abutting the primary electrode and the secondary electrode,
the nanovoided polymer layer has a first refractive index in an unactuated state and a second refractive index different than the first refractive index in an actuated state;
the actuated state corresponds to an electric potential applied between the primary electrode and secondary electrode; and
the second refractive index results from a compression of nanovoids in the nanovoided polymer layer by the electric potential in the actuated state; and
the dielectric environment and the structured layer are refractive index matched when the nanovoided polymer layer is in the actuated state.

11. The optical element of claim 10, wherein the dielectric environment is disposed directly over the structured layer.

12. A method comprising:
forming a primary electrode;
forming a structured layer over the primary electrode, wherein the structured layer comprises a non-nanovoided polymer;
forming a dielectric layer over the structured layer; and
forming a secondary electrode;
wherein:
the dielectric layer comprises a nanovoided polymer and the nanovoided polymer is disposed between and abutting the primary electrode and the secondary electrode;
the nanovoided polymer has a first refractive index in an unactuated state and a second refractive index different than the first refractive index in an actuated state;
the actuated state corresponds to an electric potential applied between the primary electrode and secondary electrode;
the second refractive index results from a compression of nanovoids in the nanovoided polymer by the electric potential in the actuated state; and
the dielectric layer and the structured layer are refractive index matched when the nanovoided polymer is in the actuated state.

13. The method of claim 12, further comprising shining light on the structured layer, wherein the structured layer comprises a grating having a period in at least one dimension of less than λ/5, where λ is a wavelength of the light.

14. The method of claim 12, further comprising applying the electric potential between the primary electrode and the secondary electrode.

15. The method of claim 12, wherein the secondary electrode is formed directly over the structured layer.

16. The optical element of claim 10, wherein the structured layer comprises a grating having a period in at least one dimension of less than $\lambda/5$, where $\lambda$ is a wavelength of light incident on the optical element.

17. The optical element of claim 10, wherein the nanovoided polymer layer is configured to have a higher refractive index in the actuated state due to the compression of the nanovoids in the nanovoided polymer layer.

18. The optical element of claim 10, wherein the nanovoided polymer layer comprises a uniform void topology.

19. The optical element of claim 10, wherein the nanovoided polymer layer comprises a non-uniform void topology.

* * * * *